United States Patent
Furuya et al.

(10) Patent No.: US 6,806,109 B2
(45) Date of Patent: Oct. 19, 2004

(54) METHOD OF FABRICATING NITRIDE BASED SEMICONDUCTOR SUBSTRATE AND METHOD OF FABRICATING NITRIDE BASED SEMICONDUCTOR DEVICE

(75) Inventors: Hiroyuki Furuya, Nara (JP); Toshiya Yokogawa, Nara (JP); Akihiko Ishibashi, Osaka (JP); Yoshiaki Hasegawa, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/620,432

(22) Filed: Jul. 17, 2003

(65) Prior Publication Data

US 2004/0087051 A1 May 6, 2004

Related U.S. Application Data

(63) Continuation of application No. PCT/JP02/13350, filed on Dec. 20, 2002.

(30) Foreign Application Priority Data

Dec. 20, 2001 (JP) .................................... 2001-387033

(51) Int. Cl.[7] ........................ H01L 21/00; H01L 21/20; H01L 21/301
(52) U.S. Cl. ........................ 438/22; 438/33; 438/438; 438/479; 438/464; 438/977
(58) Field of Search ................ 438/21–47, 479–509, 438/459–465

(56) References Cited

U.S. PATENT DOCUMENTS 5,981,977 A * 11/1999 Furukawa et al. ............ 257/94
6,113,685 A * 9/2000 Wang et al. .................... 117/3
6,377,596 B1 * 4/2002 Tanaka et al. ................ 372/45

(List continued on next page.)

FOREIGN PATENT DOCUMENTS

| EP | 1 184 897 A1 | 3/2000 |
|---|---|---|
| EP | 1 278 233 A1 | 1/2003 |
| JP | 11-191657 | 7/1999 |
| JP | 2000-156002 A | 6/2000 |
| JP | 2000-228539 A | 8/2000 |
| JP | 2000-331937 A | 11/2000 |
| JP | 2000-331947 A | 11/2000 |

(List continued on next page.)

OTHER PUBLICATIONS

I. Kidoguchi et al., "Improvement of Crystalline Quality in GaN Films by Air–Bridged Lateral Epitaxial Growth", Jpn. J. Appl. Phys., Part 2, vol. 39, No. 5B, (2000), pp. L453–456.

S. Nakamura, "InGaN/GaN/Al GaN–based laser diodes grown on epitaxially laterally overgrown GaN", Journal of Materials Research, Commentaries and Reviews, vol. 14, No. 7, Jul. 1999, pp. 2716–2731.

S. Nakamura et al., "High–Power; Long–Lifetime InGaN/GaN/AlGaN–Based Laser Diodes Grown on Pure GaN Substrates", Jpn. J. Appl. Phys., vol. 37, Mar. 15, 1998, pp. L309–L312.

*Primary Examiner*—Savitri Mulpuri
(74) *Attorney, Agent, or Firm*—McDermott Will & Emery LLP

(57) ABSTRACT

On a sapphire base (701), a GaN layer (702) and a substrate separating layer (703) are sequentially deposited, and the GaN layer (702) and the substrate separating layer (703) are processed to have a plurality of ridge stripes (702*a*) and recess portions (702*b*). Subsequently, a GaN based semiconductor layer (706) is grown on a C surface (703*c*) of the substrate separating layer (703) exposed on top of ridge stripes (702*a*) as seed crystal. The C surface (703*c*) of the substrate separating layer (703) is irradiated with a laser beam (802) to remove the substrate separating layer (703), thereby separating the GaN based semiconductor layer (706) from the sapphire base (701).

22 Claims, 11 Drawing Sheets

U.S. PATENT DOCUMENTS

| | | | |
|---|---|---|---|
| 6,426,264 B1 * | 7/2002 | Kawai | 438/311 |
| 6,562,701 B2 * | 5/2003 | Ishida et al. | 438/479 |
| 6,617,261 B2 * | 9/2003 | Wong et al. | 438/778 |
| 6,677,173 B2 * | 1/2004 | Ota | 438/22 |
| 2002/0056846 A1 * | 5/2002 | Tsuda et al. | 257/86 |
| 2002/0145148 A1 * | 10/2002 | Okuyama et al. | 257/88 |
| 2002/0182839 A1 * | 12/2002 | Ogawa et al. | 438/604 |
| 2003/0087467 A1 * | 5/2003 | Oohata et al. | 438/47 |
| 2003/0143771 A1 * | 7/2003 | Kidoguchi et al. | 438/46 |
| 2003/0180977 A1 * | 9/2003 | Suzuki et al. | 438/22 |
| 2003/0183827 A1 * | 10/2003 | Kawaguchi et al. | 257/79 |
| 2003/0203629 A1 * | 10/2003 | Ishibashi et al. | 438/689 |

FOREIGN PATENT DOCUMENTS

| | | | |
|---|---|---|---|
| JP | 2001-93837 A | | 4/2001 |
| JP | 2001-176813 A | | 6/2001 |
| JP | 2001-168042 A | | 8/2001 |
| JP | 2001217503 | * | 8/2001 |
| JP | 2001-313259 A | | 11/2001 |
| JP | 2001-342100 A | | 12/2001 |
| JP | 2002-110569 A | | 4/2002 |
| JP | 2002-353152 A | | 12/2002 |

* cited by examiner

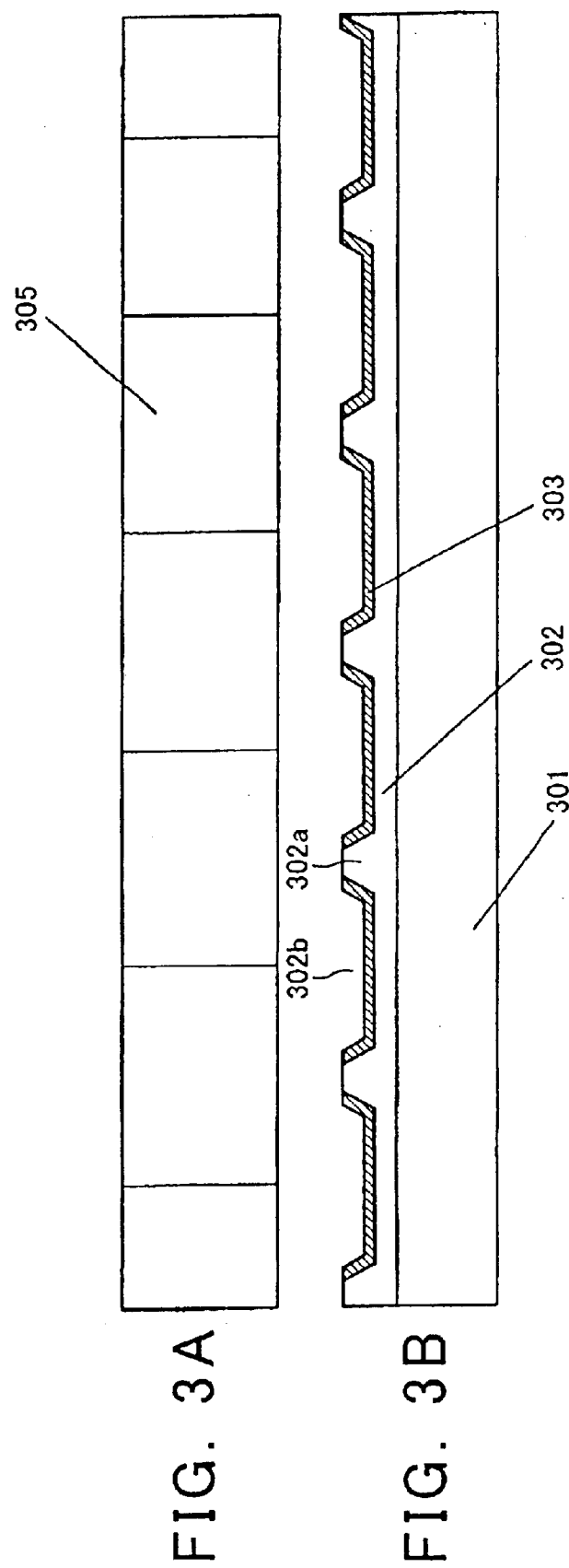

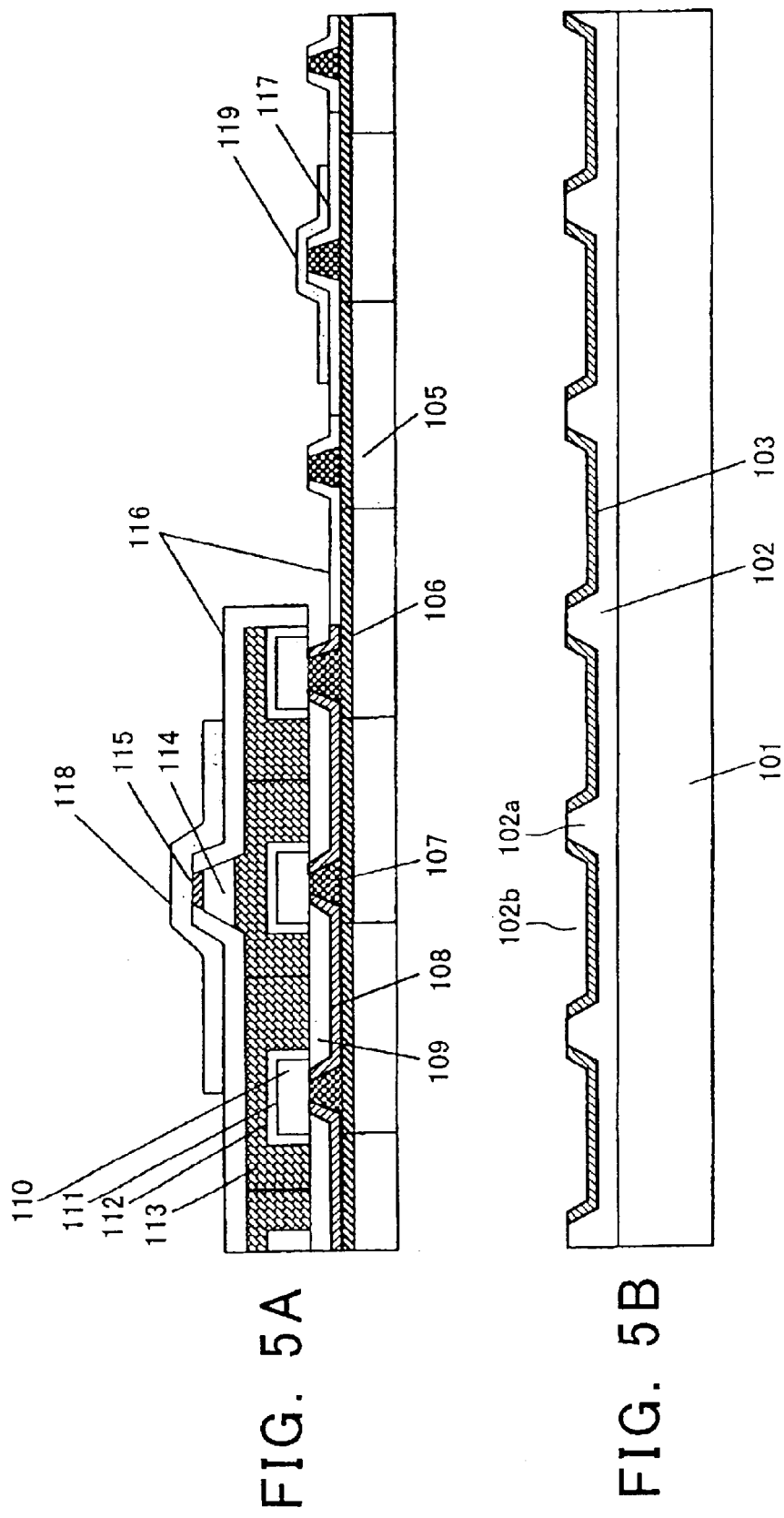

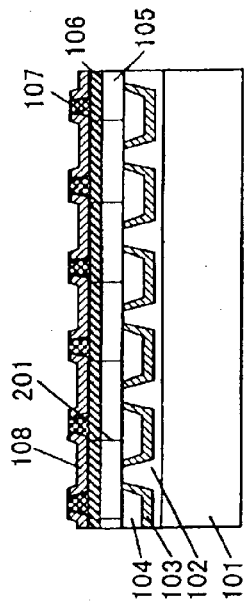
FIG. 6A
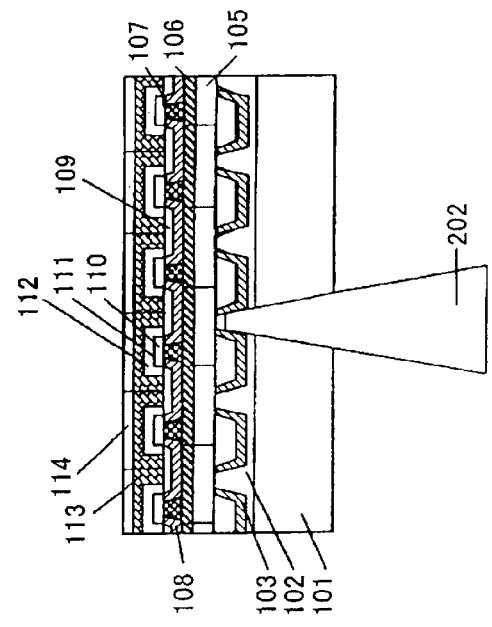
FIG. 6B
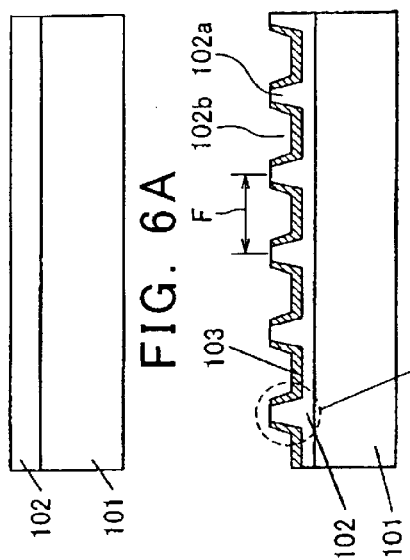
FIG. 6C
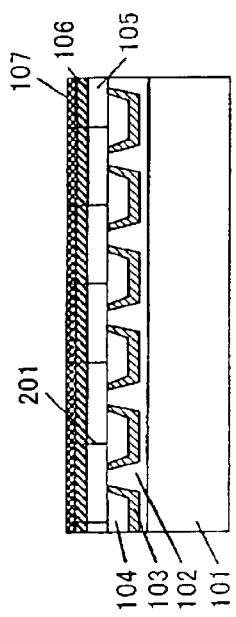
FIG. 6D
FIG. 6E

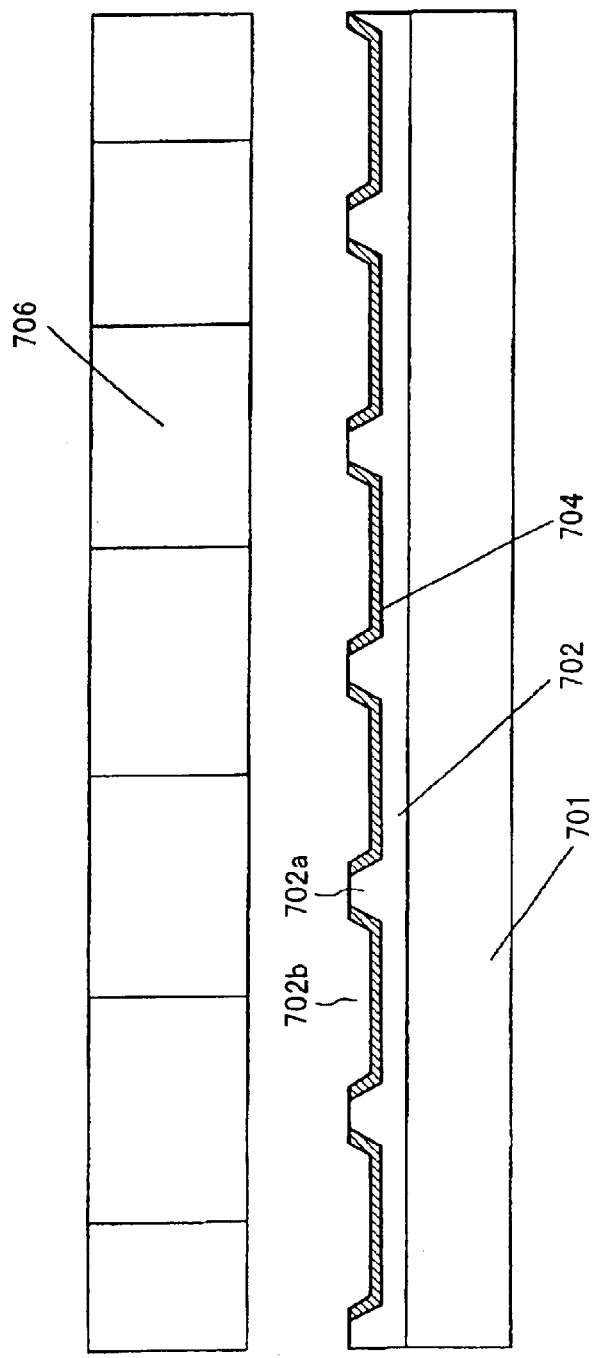

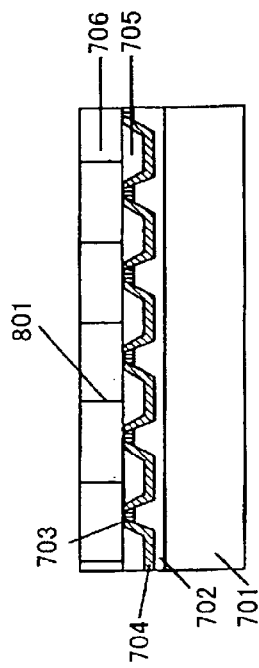
FIG. 8C
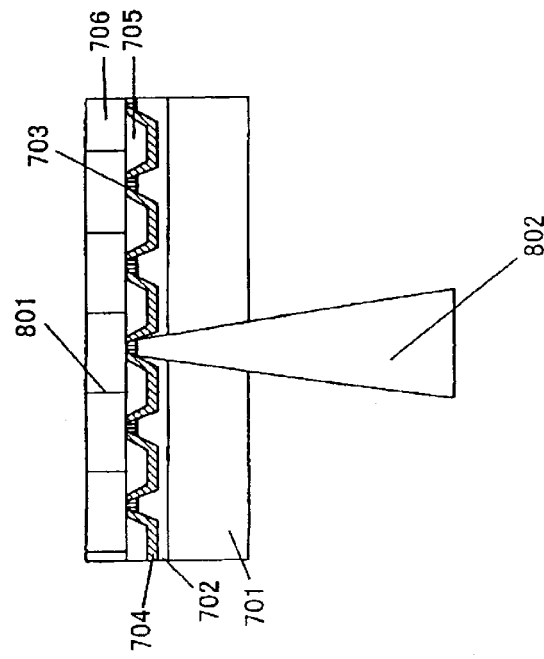
FIG. 8D
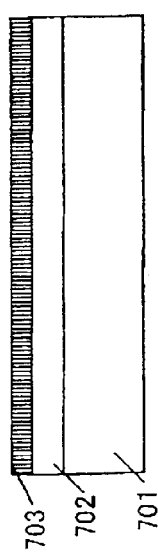
FIG. 8A
FIG. 8B

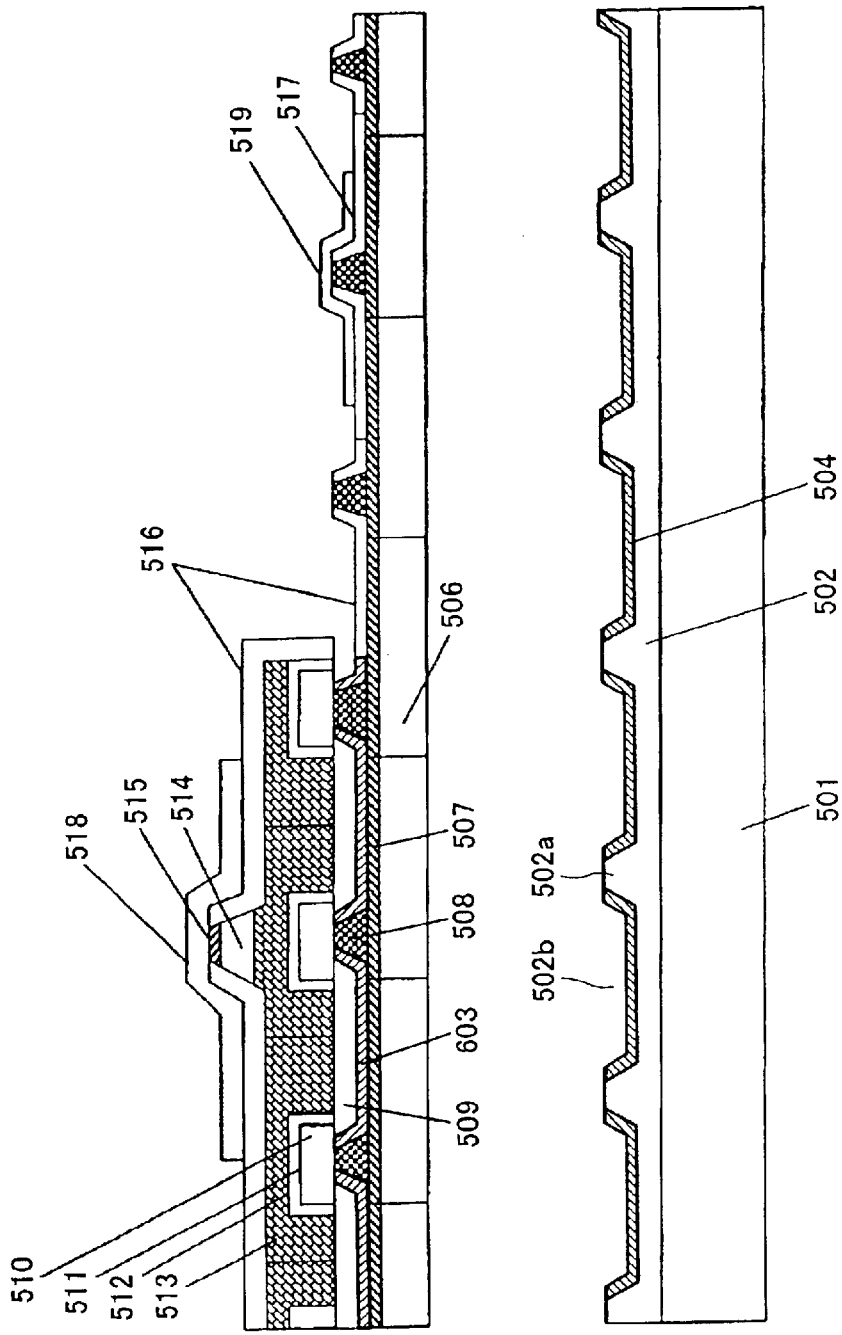

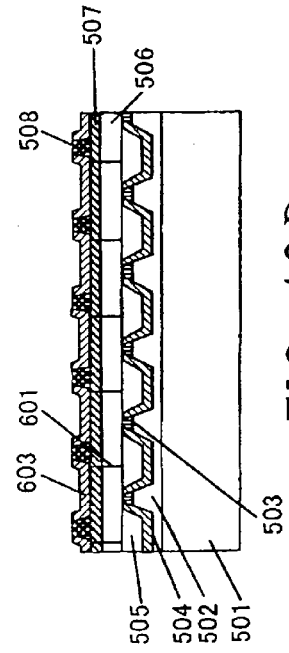
FIG. 10A
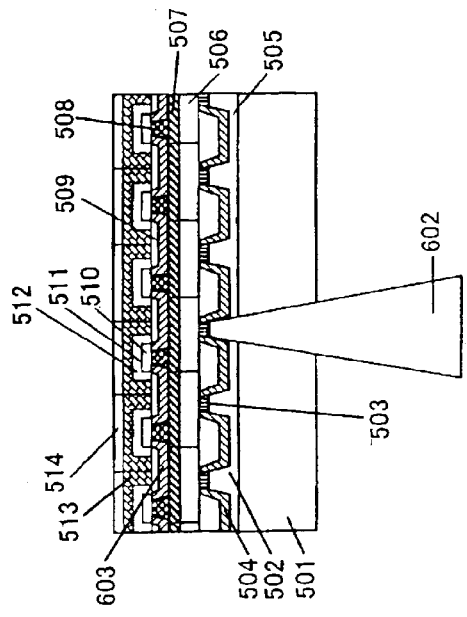
FIG. 10B
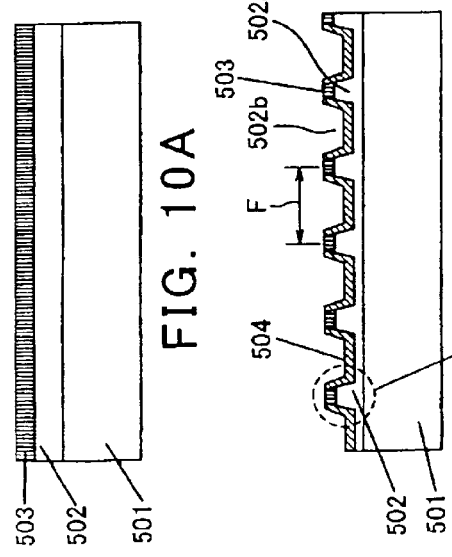
FIG. 10D
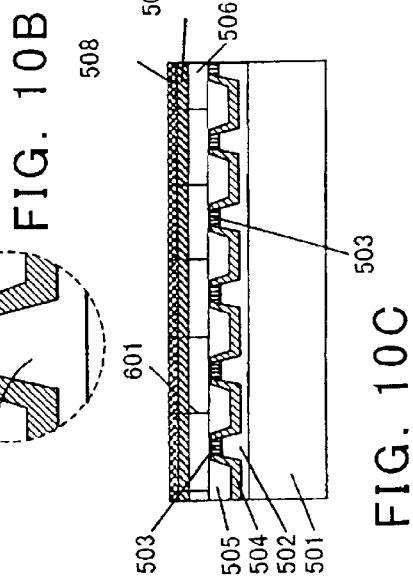
FIG. 10E
FIG. 10C

METHOD OF FABRICATING NITRIDE BASED SEMICONDUCTOR SUBSTRATE AND METHOD OF FABRICATING NITRIDE BASED SEMICONDUCTOR DEVICE

This is a continuation application under 35 U.S.C. 111(a) of pending prior International Application No. PCT/JP02/13350, filed on Dec. 20, 2002.

BACKGROUND OF THE INVENTION

1. Technical Field

The present invention relates to a method of fabricating a nitride based semiconductor substrate for use in a nitride based semiconductor laser or the like which is expected to be applied to fields such as optical information processing and radio communication, and a method of fabricating a nitride based semiconductor device.

2. Related Art

A nitride based semiconductor having nitride (N) as V-group element is considered to be promising as a material of a short wavelength light-emitting element and a high power semiconductor circuit because of its large bandgap. In particular, a gallium nitride based compound semiconductor (GaN based semiconductor: $Al_xGa_yIn_zN(0 \leq x,y,z \leq 1, x+y+z=1)$) has been intensively studied, and a blue light-emitting diode (LED) and a green LED have been put into practical use. Meanwhile, for achieving a large-capacity optical disc system, a semiconductor laser having an oscillation wavelength in 400 nm band has come to draw attention. At present, the semiconductor laser is practically used.

FIG. 1 is a cross-sectional view schematically showing a structure of the conventional GaN based semiconductor laser. As shown in FIG. 1, on a sapphire base 1701, a GaN buffer layer 1702, a n-GaN layer 1703, a n-AlGaN cladding layer 1704, a n-GaN light guiding layer 1705, a multiple quantum well (MQW) active layer 1706 comprised of $Ga_{1-x}In_xN/Ga_{1-y}In_yN$ (0<y<x<1), a p-GaN light guiding layer 1707, a p-AlGaN cladding layer 1708, a p-GaN contact layer 1709 are deposited as crystals grown by a metalorganic Vapor Phase Epitaxy (MOVPE) process. On the p-GaN contact layer 1709, a ridge strip having a width of approximately 3 μm is provided, and both sides thereof are covered by the insulating film such as $SiO_2$ 1711. On the ridge strip and the $SiO_2$ 1711, a p electrode 1710 comprised of, for example, Ni/Au, is provided, and an electrode 1712 comprised of, for example, Ti/Al is provided on a surface of part of the n-Ga N layer 1703 exposed by etching.

In the semiconductor laser so structured, upon the n electrode 1712 being grounded and a forward voltage being applied to the p electrode 1710, positive holes migrate from the p electrode 1710 side toward the MQW active layer 1706 and electrons migrate from the n electrode 1712 side toward the MQW active layer 1706. This results in optical gain inside the MQW active layer 1706 and laser oscillation having an oscillation wavelength of 400 nm band. The oscillation wavelength varies depending on a composition and thickness of $Ga_{1-x}In_xN/Ga_{1-y}In_yN$ thin film as a material of the MQW active layer 1706. At present, continuous oscillation at temperatures higher than a room temperature, is implemented. A high-power semiconductor circuit using these techniques is studied and is expected to be achieved in fields such as semiconductor devices for radio communications.

As a substrate on which GaN based crystal is grown, a sapphire base, a SiC (silicon carbide) substrate, or a Si (silicon) substrate is used. But, these substrates lattice-mismatch to GaN, and therefore crystal growth becomes difficult. This results in a number of dislocations (blade-shaped dislocation, spiral dislocation, mixed dislocation). For example, when using the sapphire base or the SiC substrate, dislocations of approximately $1 \times 10^9$ cm$^{-2}$ exist. As a result, a threshold current of a semiconductor laser is increased and reliability of the semiconductor laser is degraded.

A first article as a known literature "Journal of Material Research, Vol. 14 (1999) pp. 2716–2731" proposes an Epitaxial Lateral Over Growth (ELOG) as a method of reducing dislocation density. This method is effective in reducing through dislocations in a system having large lattice mismatching.

FIG. 2 is a cross-sectional view schematically showing a structure of GaN crystal formed by ELOG. On a sapphire base 1801, GaN crystal 1802 is formed by the MOVPE process or the like. On the GaN crystal 1802, $SiO_2$ 1803 is formed by a CVD (Chemical Vapor Deposition) process or the like. The $SiO_2$ 1803 is processed in stripes by photolithography and etching. A GaN based semiconductor layer 1804 is deposited by selectively growing an exposed portion of the GaN crystal 1802 as seed crystal. As a growing process, the MOVPE process or a hydride vapor phase epitaxy process (HVPE process) is used. Above the seed crystal, a region 1806 having a number of dislocations of approximately as high as $1 \times 10^9$ cm$^{-2}$ exists, but a region 1805 which is laterally grown has dislocation density as low as approximately $1 \times 10^7$ cm$^{-2}$. An active region is provided above the region 1805 with fewer dislocations, thereby improving reliability. Since the other structure in FIG. 2 is identical to a structure of the conventional semiconductor laser in FIG. 1, the same or corresponding parts are identified by the same reference numerals and will not be further described.

In recent years, fabrication of a GaN substrate has been intensively studied.

A second article as a known literature "Japanese Journal of Applied Physics, Vol. 37 (1998) pp. L 309–L312" illustrates a method in which a sapphire base is removed by polishing in a GaN based semiconductor layer grown on the sapphire base, thereby obtaining a GaN substrate. A third article as a known literature "Japanese Journal of Applied Physics, Vol. 38 (1999) pp. L217–L219" illustrates a method in which a GaN based semiconductor layer is separated (lifted off) from the vicinity of a sapphire base by irradiation of a laser beam using a third harmonic (wavelength of 355 nm) of Nd:YAG laser. It is considered that the GaN based semiconductor layer is thus separated by irradiation of the laser beam due to the fact that the GaN based semiconductor layer in the vicinity of the sapphire base has low quality and high carrier concentration.

Related Arts are disclosed in Japanese Laid-Open Patent Application Publication No. Hei. 11-191657 that discloses a method of growing nitride semiconductor and Japanese Laid-Open Patent Application Publication No. 2001-93837 that discloses a structure of a semiconductor thin film and a fabrication method thereof.

However, in the methods illustrated in the second and third articles, due to difference in thermal expansion coefficient between sapphire and GaN, a number of cracks occur in the GaN based semiconductor layer when separating the GaN based semiconductor layer from the sapphire base. For this reason, a GaN substrate having a large area equal to a two-inch wafer level is impossible to obtain. In addition, in these methods, it is not easy to control separation between the sapphire base and the GaN based semiconductor layer.

In a semiconductor device with the GaN based semiconductor layer disposed on the sapphire base, the GaN based semiconductor layer is subjected to a stress due to large difference in lattice constant between the sapphire base and the GaN based semiconductor layer grown thereon. This reduces reliability of yield and productivity as well as an electric property. Therefore, it is necessary to separate the GaN based semiconductor layer from the sapphire base and form constituents on the GaN based semiconductor substrate.

The present invention has been made under the circumstances, and an object of the present invention is to provide a method of fabricating a nitride based semiconductor substrate with high controllability in separation between the sapphire base and the GaN based semiconductor layer.

SUMMARY OF THE INVENTION

To achieve the above-described object, according to the present invention, there is provided a method of fabricating a nitride based semiconductor substrate, comprising the steps of depositing a first nitride based semiconductor layer on a base; processing the first nitride based semiconductor layer to have ridge portions and recess portions; coating side surfaces of the ridge portions and bottom surfaces of the recess portions with an amorphous insulating film; growing a second nitride based semiconductor layer on a region of the first nitride based semiconductor layer other than a region thereof coated with the amorphous insulating film, the region of the first nitride based semiconductor layer serving as seed crystal; and separating the second nitride based semiconductor layer from the ridge portions by irradiating the region corresponding to the seed crystal with a laser beam.

It is preferable that the method of fabricating a nitride based semiconductor substrate, further comprises the step of thermally annealing the base with the first and second nitride based semiconductor layers deposited thereon, before the separating step.

It is preferable that in the method of fabricating a nitride based semiconductor substrate, the laser beam has a wavelength of 190 nm to 550 nm.

It is preferable that in the method of fabricating a nitride based semiconductor substrate, the ridge portions are ridge stripes and a direction of the stripes is a <1–100> direction of nitride.

According to the present invention, there is provided a method of fabricating a nitride based semiconductor device, comprising the steps of depositing a first nitride based semiconductor layer on a base; processing the first nitride based semiconductor layer to have ridge portions and recess portions; coating side surfaces of the ridge portions and bottom surfaces of the recess portions with an amorphous insulating film; growing a second nitride based semiconductor layer on a region of the first nitride based semiconductor layer other than a region thereof coated with the amorphous insulating film, the region of the first nitride based semiconductor layer serving as seed crystal; depositing a layer having an active layer structure with an active layer interposed between semiconductor layers of different conductivity types, on the second nitride based semiconductor layer; and separating the second nitride based semiconductor layer from the ridge portions by irradiating the region corresponding to the seed crystal with a laser beam.

According to the present invention, there is further provided a method of fabricating a nitride based semiconductor substrate, comprising the steps of depositing a first nitride based semiconductor layer on a base; depositing a second nitride based semiconductor layer on the first nitride based semiconductor layer; processing the first and second nitride based semiconductor layers to have ridge portions and recess portions; coating side surfaces of the ridge portions and bottom surfaces of the recess portions with an amorphous insulating film; growing a third nitride based semiconductor layer on a region of the second nitride based semiconductor layer other than a region thereof coated with the amorphous insulating film, the region of the second nitride based semiconductor layer serving as seed crystal; and separating the second nitride based semiconductor layer from the ridge portions by irradiating the region corresponding to the seed crystal with a laser beam.

It is preferable that the method of fabricating a nitride based semiconductor substrate, further comprises the step of depositing a layer having an active layer structure with an active layer interposed between semiconductor layers of different conductivity types, on the third nitride based semiconductor layer, before the separating step.

It is preferable that the method of fabricating a nitride based semiconductor substrate may further comprise thermally annealing the base with the first, second, and third nitride based semiconductor layers deposited thereon.

It is preferable that in the method of fabricating a nitride based semiconductor substrate, the ridge portions are ridge stripes and a direction of the stripes is a <1–100> direction of nitride.

It is preferable that in the method of fabricating a nitride based semiconductor substrate, the laser beam has a wavelength of 190 nm to 550 nm.

It is preferable that in the method of fabricating a nitride based semiconductor substrate, the second nitride based semiconductor layer is comprised of semiconductor compound containing three or more elements belonging to III–V groups.

It is preferable that in the method of fabricating a nitride based semiconductor substrate, the second nitride based semiconductor layer has bandgap smaller than bandgap of the third nitride based semiconductor layer.

It is preferable that in the method of fabricating a nitride based semiconductor substrate, the second nitride based semiconductor layer contains at least As.

It is preferable that in the method of fabricating a nitride based semiconductor substrate, the second nitride based semiconductor layer contains at least In.

It is preferable that in the method of fabricating a nitride based semiconductor substrate, the second nitride based semiconductor layer contains at least P.

According to the present invention, there is further provided a method of fabricating a nitride based semiconductor device, comprising the steps of depositing a first nitride based semiconductor layer on a base; depositing a second nitride based semiconductor layer on the first nitride based semiconductor layer; processing the first and second nitride based semiconductor layers to have ridge portions and recess portions; coating side surfaces of the ridge portions and bottom surfaces of the recess portions with an amorphous insulating film; growing a third nitride based semiconductor layer on a region of the second nitride based semiconductor layer other than a region thereof coated with the amorphous insulating film, the region of the second nitride based semiconductor layer serving as seed crystal; depositing a layer having an active layer structure with an active layer interposed between semiconductor layers of different conductivity types, on the third nitride based semiconductor layer; and separating the second nitride based semiconductor layer from the ridge portions by irradiating the region corresponding to the seed crystal with a laser beam.

This object, as well as other objects, features and advantages of the invention will become more apparent to those skilled in the art from the following description taken with reference to the accompanying drawings.

BRIEF DESCRIPTION OF THE DRAWINGS

FIG. 3A is a cross-sectional view showing a structure of a GaN based semiconductor substrate fabricated by a fabrication method according to a first embodiment of the present invention, and FIG. 3B is a cross-sectional view showing a structure of a substrate separated from the GaN based semiconductor substrate in a fabrication step thereof;

FIG. 5A is a cross-sectional view showing a structure of a semiconductor laser fabricated by a fabrication method according to a second embodiment of the present invention, and FIG. 5B is a cross-sectional view showing a structure of a substrate separated from a semiconductor laser in a fabrication step thereof;

FIG. 6A to FIG. 6E are cross-sectional views showing steps of the fabrication method according to the second embodiment of the present invention;

FIG. 7A is a cross-sectional view showing a structure of a GaN based semiconductor substrate fabricated by a fabrication method according to a third embodiment of the present invention, and FIG. 7B is a cross-sectional view showing a structure of a substrate separated from a semiconductor laser in a fabrication step thereof;

FIG. 8A to FIG. 8D are cross-sectional views showing steps of the fabrication method according to the third embodiment of the present invention;

FIG. 9A is a cross-sectional view showing a structure of a semiconductor laser fabricated by a fabrication method according to a fourth embodiment of the present invention, and FIG. 9B is a cross-sectional view showing a structure of a substrate separated from a semiconductor laser in a fabrication step thereof;

FIG. 10A to FIG. 10E are cross-sectional views showing steps of the fabrication method according to the fourth embodiment of the present invention.

DETAILED DESCRIPTION OF THE PREFERRED EMBODIMENTS

Figure 1:
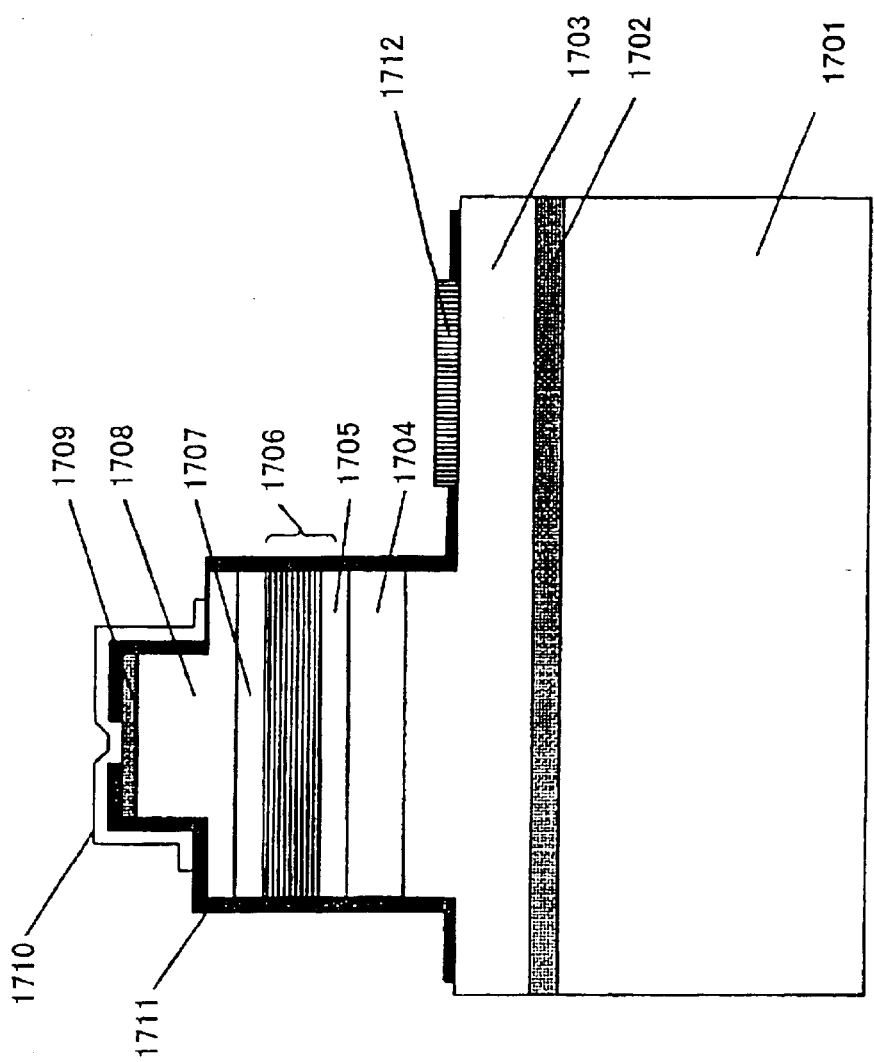
FIG. 1 is a cross-sectional view schematically showing a structure of the conventional GaN based semiconductor laser.
Figure 2:
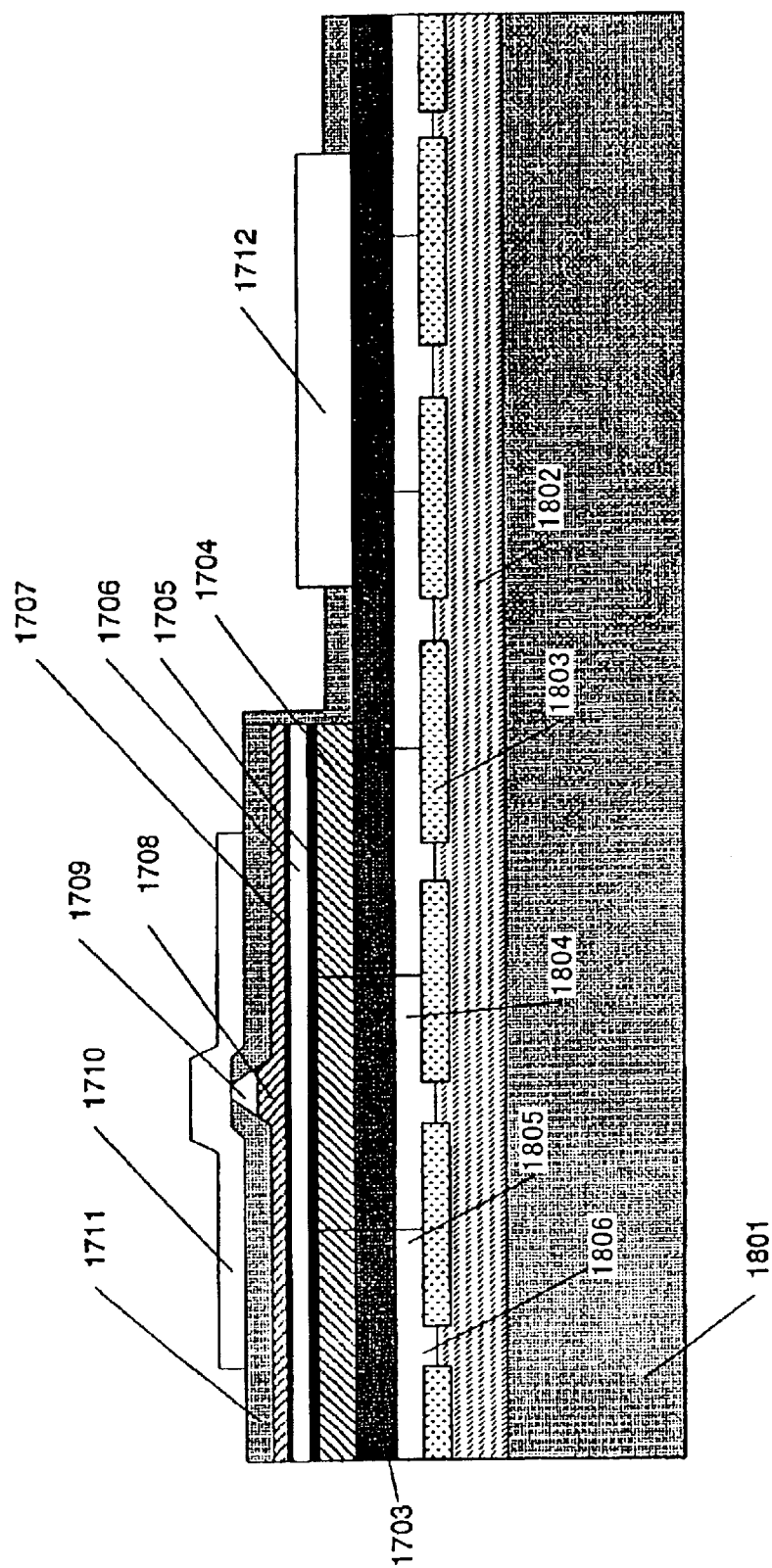
FIG. 2 is a cross-sectional view schematically showing a structure of GaN crystal formed by ELOG.

Hereinafter, embodiments of the present invention will be described in detail with reference to drawings. While a MOVPE process is illustrated as a method of growing a nitride based semiconductor layer, all processes which have been proposed thus far to grow the nitride based semiconductor layer, may be used, including a HVPE process, a CVD process, etc. Also, some dimensions in the drawings are exaggerated, and therefore, do not always coincide with actual sizes.

[Embodiment 1]

FIG. 3A is a cross-sectional view showing a structure of a GaN based semiconductor substrate fabricated by a fabrication method according to a first embodiment of the present invention, and FIG. 3B is a cross-sectional view showing a structure of a substrate separated from the GaN based semiconductor substrate in a fabrication step thereof. FIG. 4A to FIG. 4D are cross-sectional views showing steps of the fabrication method according to this embodiment.

In FIG. 3A, reference numeral 305 denotes a GaN based semiconductor substrate. In FIG. 3B, reference numeral 301 denotes a sapphire base, and on the sapphire base 301, a GaN layer 302 is provided. The GaN layer 302 is processed to have a plurality of ridge stripes 302a and recess portions 302b. Over side surfaces of the ridge stripes 302a and bottom surfaces of the recess portions 302b, a $SiN_x$ layer 303 comprised of an amorphous insulating film, is provided. As mentioned later, the GaN based semiconductor substrate 305 shown in FIG. 3A is fabricated by separating the same from the sapphire base 301 or the like shown in FIG. 3B.

Next, a detail of the fabrication method according to this embodiment will be described.

First of all, a surface of the sapphire base 301 is cleaned by an acid solution. Then, the cleaned sapphire base 301 is held in a susceptor inside a reactor of a MOVPE unit and the reactor is evacuated. Following this, inside the reactor, a hydrogen atmosphere is set at a pressure of approximately 40 kPa and the sapphire base 301 is heated at a temperature elevated up to about 1100° C. to allow its surface to be thermally cleaned for about 10 minutes.

Subsequently, inside the reactor, the temperature is reduced to about 500° C. Thereafter, simultaneously, trimethyl gallium (TMG) is fed at 25 mmol/min, an ammonia ($NH_3$) gas is fed at 7.5 L/min, and hydrogen as a carrier gas is fed, onto the sapphire base 301. Thereby, a low-temperature buffer layer comprised of GaN is grown to be 20 nm thick.

Figure 4A:
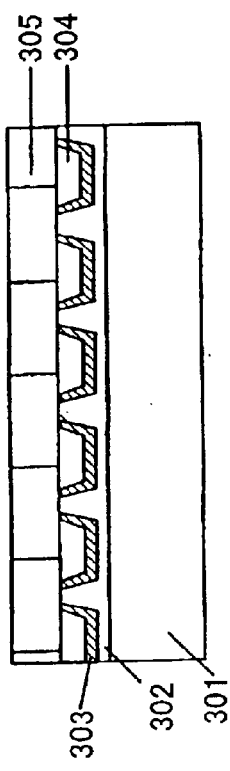
FIG. 4A to FIG. 4D are cross-sectional views showing steps of the fabrication method according to the first embodiment of the present invention.

Thereafter, the temperature is increased up to 1020° C., and TMG and $NH_3$ are fed, to deposit a GaN layer 302 (FIG. 4A). At this time, its surface is a C surface.

Figure 4B:
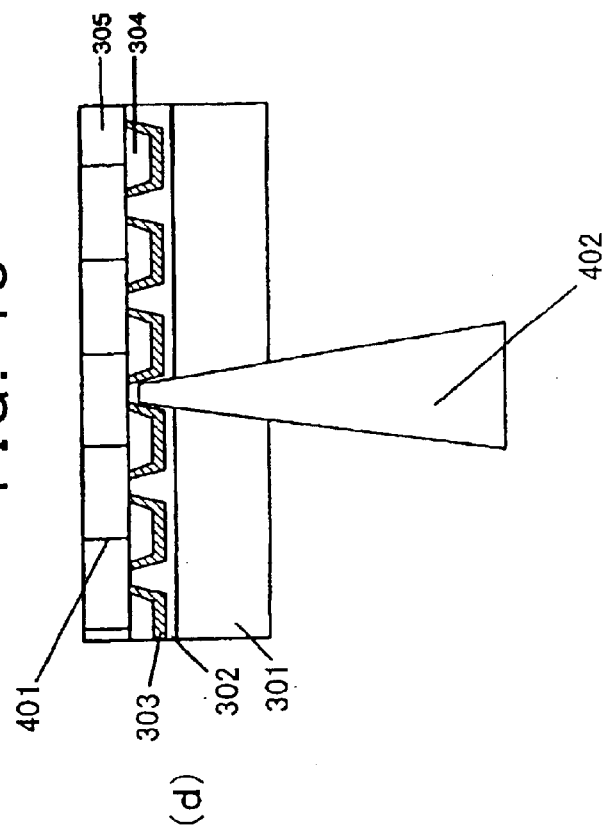
Figure 4C:
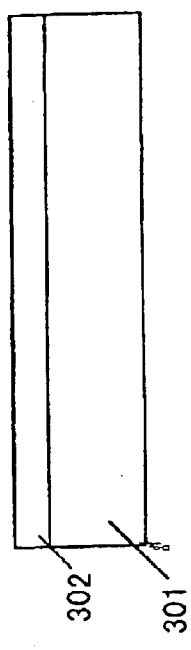
Figure 4D:
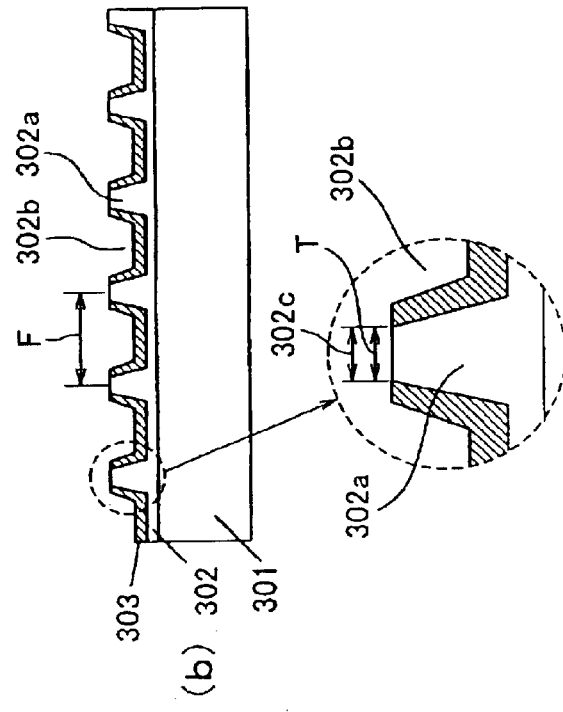

Then, using a photolithography technique and a dry etching technique, the GaN layer 302 is formed to have recesses (concave portions), thereby forming periodic ridge stripes. Then, using a technique for depositing an insulating film such as ECR sputtering, the $SiN_x$ layer 303 (10 nm thick) as the amorphous insulating film is deposited over the side surfaces of the ridge stripes 302a and the bottom surfaces of the recess portions 302b (FIG. 4B).

The ridge stripes 302a formed in the GaN layer 302 have a period F of 16 μm and a width T of 4 μm. While the period F of the ridge stripes 302a is 16 μm and the width T thereof is 4 μm, they are only illustrative. It should be noted that air gaps with a good shape which is mentioned later are not obtained when the period F of the ridge stripes 302a is too large, and that dislocations are not reduced effectively when the period F is too small. The period F of the ridge stripes 302a is preferably approximately 5 μm to 100 μm, and more preferably, approximately 10 μm to 50 μm. In addition, the dislocations are not effectively reduced when the width T of the ridge stripes 302a is too large, and crystallinity of the GaN based semiconductor layer is reduced because a region corresponding to seed crystal mentioned later is small when the width T is too small. Accordingly, the width T of the ridge stripes 302a is preferably approximately 1 μm to 10 μm, and more preferably 2 μm to 8 μm.

A direction of the stripes of the ridge stripes 302a formed in the GaN layer 302 is <1–100> direction of GaN. This is because, when the GaN based semiconductor substrate obtained as mentioned layer is used in the semiconductor laser, the longitudinal direction of a resonator preferably coincides with the direction of the stripes. As used herein, the <1–100> direction is <1100> direction. These directions mean the same in Specification and Claims.

On a C surface of the GaN layer 302 exposed on top of the ridge stripes 302a(regions represented by 302c in an enlarged portion in FIG. 4B), as the seed crystal, a GaN based semiconductor layer 305 is sequentially deposited by crystal growth (FIG. 4C) As a result, between the SiN$_x$ layer 303 and the GaN based semiconductor layer 305, air gaps 304 are created. Thus, in this embodiment, crystal is grown only on the regions 302C and is not grown on the other regions, for example, the ridge stripes 302a or the recess portions 302b. Parts of the GaN based semiconductor layer 305 are joined in the vicinity of the center of each of the air gaps 304 to form a joint portion 401.

Thereafter, the entire or part of the regions 302C in the GaN layer 302 as the seed crystal of the GaN based semiconductor laser 305 is irradiated with a ultraviolet laser beam 402 (Nd: a third harmonic of YAG laser (wavelength of 355 nm)), from the direction of a rear surface of the sapphire base 301. Thereby, the regions 302c are photochemically degraded. As a result, the GaN based semiconductor layer 305 is separated from the sapphire base 301.

Thus, the GaN based semiconductor layer 305 shown in FIG. 1A, i.e., the GaN based semiconductor substrate 305 is fabricated.

As mentioned previously, as a previous step of the step of separating the GaN based semiconductor layer 305 from the sapphire base 301 using the laser, the substrate after crystal growth is carried into an open quarts pipe, where the substrate is thermally annealed at about 1000° C. in nitrogen atmosphere for about 6 hours. This facilitates the separating step. In view of damages such as release of nitrogen atoms from the GaN layer 302, the annealing temperature is desirably set to 1200° C. or lower.

In the step of separating the GaN based semiconductor layer 305 from the sapphire base 301 using the laser, the wavelength of the laser beam is preferably set between 150 nm and 400 nm. Preferably, the laser beam is focused in such a manner that a beam waist is applied to the regions of the GaN layer 302 in the vicinity of seed crystal of the GaN based semiconductor layer 305 to allow an energy density of the laser beam to be greatly increased in these region.

Three possible methods of scanning the laser beam are (1) combination of a galvanometer mirror and f-θ lens, (2) combination of a polygon mirror and f-θ lens, and (3) movement of x-y stage. In order to keep the focused laser beam at a proper position, it is desirable to perform scanning by the method of moving the x-y stage (3). Here, preferably, the scan direction corresponds with the direction of the stripes, i.e., <1–100> direction of GaN.

In this embodiment, in the step of separating the GaN based semiconductor layer 305 from the sapphire base 301, re-grown GaN based semiconductor layer hardly adheres to the substrate because of the presence of the air gaps defined by the side surfaces of the ridge stripes 302a and the bottom surfaces of the recess portions 302b which are formed in the GaN layer 302, and the re-grown crystal. As a result, the GaN based semiconductor layer is separated from the sapphire base more easily and quality of the separated GaN based semiconductor layer (i.e., GaN based semiconductor substrate) is higher than that in the prior art.

The quality, i.e., crystallinity, will be described below. Crystal defects contained in the GaN layer 302 are vertically grown when growing a new semiconductor layer on the GaN layer 302. For this reason, the regions of the GaN based semiconductor substrate 305 located directly above the ridge stripes 302a are high dislocation density regions having a dislocation density (frequency of crystal defects) of approximately $1 \times 10^9$ cm$^{-2}$. On the other hand, the regions of the GaN based semiconductor substrate 305 located directly above the recess portions 302b are low dislocation density regions having a dislocation density of $1 \times 10^7$ cm$^{-2}$. It is desired that an active layer have a low dislocation density. Therefore, when the semiconductor layer is grown on the GaN based semiconductor substrate 305 to obtain the semiconductor laser device, it is desirable that the active layer overlap with the low dislocation density regions, i.e., the active layer be located directly above the low dislocation density regions. The same applies to embodiments mentioned later.

While the GaN layer 302 is provided with periodic ridge stripes in this embodiment, the same effects are obtained by providing periodic lattice ridges instead.

As a matter of course, the invention is not intended to be limited to the above example, but various alternations may be made to the invention.

(Second Embodiment)

In a second embodiment of the present invention, there is illustrated a method of fabricating a semiconductor laser provided with an active layer structure on a GaN based semiconductor layer.

FIG. 5A is a cross-sectional view showing a structure of the semiconductor laser fabricated by the fabrication method according to this embodiment of the present invention, and FIG. 5B is a cross-sectional view showing a structure of a substrate separated from the semiconductor laser in a fabrication step thereof. FIG. 6A to FIG. 6E are cross-sectional views showing steps of the fabrication method according to this embodiment.

In FIG. 5A, reference numeral 105 denotes a GaN based semiconductor substrate. On the GaN based semiconductor substrate 105, a n-Al0.1Ga0.9N/n-GaN super lattice contact layer 106, and a n-Al0.03GaN0.97N cladding layer 107 are deposited. The n Al0.03GaN0.97N cladding layer 107 is provided with periodic ridge stripes 102a and recess portions 102b. Over side surfaces of part of the ridge stripe 102a and bottom surfaces of part of the recess portions 102b, a SiN$_x$ layer 108 is provided. On the surface of the ridge stripe 102a as seed crystal, a n-GaN light guiding layer 110, a multiple quantum well (MQW) active layer 111, a p-GaN light guiding layer 112, and a p-Al0.07Ga0.93N cladding layer 113 are grown and deposited.

On the p-Al0.07Ga0.93N cladding layer 113, ridge-shaped p-GaN layer 114 and p electrode 115 are provided. Over a region of the p-Al0.07Ga0.93N cladding layer 113 other than the ridge-shaped p-GaN layer 114 and p electrode 115, an insulating film 116 is provided. On the p electrode 115 and the insulating film 116, a wiring electrode 118 is provided.

Over side surfaces of part of ridge stripes and bottom surfaces of part of the recess portions in the n-Al0.03Ga0.97N cladding layer 107, an insulating film 116 is provided. On one of the ridge stripes, a n electrode 117 is provided and on the n electrode 117 and the insulating film 116, a wiring electrode 119 is provided.

In FIG. 5B, reference numeral 101 denotes a sapphire base. Over the sapphire base 101, a GaN layer 102 is provided. The GaN layer 102 is processed to have a plurality of ridge stripes 102a and recess portions 102b. Over side surfaces of the ridge stripes 102a and bottom surfaces of the recess portions 102b, a $SiN_x$ layer 103 comprised of an amorphous insulating film, is provided.

As mentioned later, a semiconductor laser shown in FIG. 5A is fabricated by separating the same from the sapphire base 101 shown in FIG. 5B.

Next, a detail of the fabrication method according to this embodiment will be described.

In the same manner described in the first embodiment, the surface of the sapphire base 101 is thermally cleaned, and then, inside the reactor of the MOVPE unit, temperature is reduced to about 500° C., followed by growing a low-temperature buffer layer comprised of GaN to be 20 nm thick on the sapphire base 101.

Thereafter, the temperature is increased up to 1020° C., and TMG and $NH_3$ are fed, to deposit the GaN layer 102 on the sapphire base 101 (FIG. 6A). At this time, its surface is a C surface.

Then, using the photolithography technique and the dry etching technique, the GaN layer 102 is processed to have recesses (concave portions), thereby forming periodic ridge stripes 102a. Then, using the technique for depositing the insulating film, such as ECR sputtering, the $SiN_x$ layer 103 as the amorphous insulating film (10 nm thick) is deposited over the side surfaces of the ridge stripes 102a and the bottom surfaces of the recess portions 102b (FIG. 6B).

The ridge stripes 102a have a period F of 16 $\mu$m and a width T of 4 $\mu$m. In this embodiment, as in the first embodiment, the period F of the ridge stripes 102a is preferably approximately 5 $\mu$m to 100 $\mu$m, and more preferably, approximately 10 $\mu$m to 50 $\mu$m. Also, the width T of the ridge stripes is preferably approximately 1 $\mu$m to 10 $\mu$m, and more preferably approximately 2 $\mu$m to 8 $\mu$m.

A direction of the stripes of the ridge stripes 102a of the GaN layer 102 is <1–100> direction of GaN. This is because, the longitudinal direction of a resonator preferably coincides with the direction of the stripes.

On the C surface of the GaN layer 102 exposed on top of the ridge (region represented by 102c in an enlarged portion in FIG. 6B), as the seed crystal, a n-Al0.03Ga0.97N layer 105 (2 $\mu$m thick), a n-Al0.1Ga0.9N/n-GaN super lattice contact layer 106 (2 $\mu$m thick), and a n-Al0.03Ga0.97N cladding layer 107 (0.5 $\mu$m thick), are sequentially deposited by a pressure-reducing MOVPE process (FIG. 6C). As a result, between the $SiN_x$ layer 103 and the n-Al0.03Ga0.97N layer 105, air gaps 104 are created. Thus, in this embodiment, crystal is grown only on the regions 102C and is not grown on the other regions, for example, the ridge stripes 102a and the recess portions 102b. Parts of the n-Al0.03GaN0.97N-layer 105 are joined in the vicinity of the center of each of the air gaps 104 to form a joint portion 201.

Then, the n-AlGaN cladding layer 107 is formed to have recesses (concave portions), thereby forming periodic ridge stripes. At this time, the n-AlGaN cladding layer 107 may be etched to the n-Al0.1Ga0.9N/n-GaN super lattice contact layer 106. Over the side surfaces of the ridge stripes and the bottom surfaces of the recess portions, the $SiN_x$ layer 108 (10 nm thick) is deposited (FIG. 6D). The period of the ridge stripes is 16 $\mu$m and the width thereof is approximately 3 $\mu$m. The ridge stripes having the width of approximately 3 $\mu$m are formed in regions with fewer through dislocations above the air gaps 104.

On the C surface of the n-Al0.07Ga0.93N cladding layer 107 exposed on top of the ridge, as seed crystal, a n-GaN light guiding layer 110 (0.2 $\mu$m thick), a multiple quantum well (MQW) active layer 111, a p-GaN light guiding layer 112 (0.1 $\mu$m thick), a p-Al0.07Ga0.93N cladding layer 113 (2 $\mu$m thick), and a p-GaN layer 114, are sequentially deposited by a pressure-reducing MOVPE method (FIG. 6E). As a result, between the $SiN_x$ layer 108 and the p-GaN light guiding layer 112 and the p-Al0.07Ga0.93N cladding layer 113, air gaps 109 are created. Parts of the p-Al0.07Ga0.93N cladding layer 113 are joined in the vicinity of the center of each of the air gaps 109.

Although not shown in FIG. 6E, as shown in FIG. 5A, the p electrode 115 is deposited on the p-GaN layer 114, and the p electrode 115, the p-GaN layer 114, and the p-AlGaN cladding layer 113 are formed to have ridges with a width of approximately 5 $\mu$m. The exposed p-Al0.07Ga0.93N cladding layer 113 is coated with the insulating film 116 comprised of $SiO_2$ or the like, thereby forming a current narrowing structure. The insulating film 116 is formed by the ECR sputtering. On the p electrode 115 and the insulating film 116, a wiring electrode 118 comprised of Au is formed to be 5 $\mu$m thick. Likewise, as shown in FIG. 5A, side surfaces of part of the ridge stripes and bottom surfaces of part of the recess portions in the n-Al0.03GaN0.97N cladding layer 107 are coated with the insulating film 116. Then, on one of the ridges stripes, the n electrode 117 is formed, and on the n electrode 117 and the insulating film 116, the wiring electrode 119 is formed.

Thereafter, as shown in FIG. 6E, the entire or part of the regions 102C of the GaN layer 102 as the seed crystal of n-Al0.03Ga0.97N layer 105 is irradiated with a ultraviolet laser beam 202 (Nd: a third harmonic of YAG laser (wavelength of 355 nm)), from the direction of a rear surface of the sapphire base 101. Thereby, the regions 102c are photochemically degraded. As a result, the GaN based crystal is separated from the sapphire base.

Thus, semiconductor laser shown in FIG. 5A is fabricated.

As a previous step of the step of separating the GaN based semiconductor layer 105 from the sapphire base 101 using the laser, thermal annealing is carried out using the method described in the first embodiment. This facilitates the separating step. Also as in the first embodiment, the method of moving the x-y stage is preferably used as the method of scanning the process laser beam.

When the GaN based semiconductor layer 105 is separated from the sapphire base 101, re-grown GaN based semiconductor layer hardly adheres to the substrate because of the presence of the air gaps surrounded by the side surfaces of the ridge stripes 102a and the bottom surfaces of the recess portions 102b, and the re-grown crystal. As a result, the GaN based semiconductor layer is separated from the sapphire base 101 more easily and quality of the separated GaN based semiconductor layer is higher than that in the prior art.

While the GaN layer 102 is provided with periodic ridge stripes in this embodiment, the same effects are obtained by providing periodic lattice ridges instead.

As a matter of course, the invention is not intended to be limited to the above example, but various alternations may be made to the invention.

(Embodiment 3)

In a third embodiment of the present invention, a method of fabricating a GaN based semiconductor substrate capable of being easily separated from a substrate by providing a substrate separating layer, will be described.

FIG. 7A is a cross-sectional view showing a structure of a GaN based semiconductor substrate fabricated by a fabrication method according to the third embodiment of the present invention, and FIG. 7B is a cross-sectional view showing a structure of a substrate separated from the GaN based semiconductor substrate in a fabrication step thereof. FIG. 8A to FIG. 8D are cross-sectional views showing steps of the fabrication method according to this embodiment.

In FIG. 7A, reference numeral 706 denotes a GaN based semiconductor substrate. In FIG. 7B, reference numeral 701 denotes a sapphire base. On the sapphire base 701, a GaN layer 702 is provided. The GaN layer 702 is processed to have a plurality of ridge stripes 702a and recess portions 702b. Over side surfaces of the ridge stripes 702a and bottom surfaces of the recess portions 702b, a $SiN_x$ layer 704 comprised of an amorphous insulating film, is provided.

As mentioned later, the GaN based semiconductor substrate 706 shown in FIG. 7A is fabricated by separating the same from the sapphire base 701 or the like shown in FIG. 7B.

Next, a detail of the fabrication method according to this embodiment will be described.

In the same manner described in the first embodiment, the surface of the sapphire base 701 is thermally cleaned, and then, inside the reactor of the MOVPE unit, the temperature is reduced to approximately 500° C., followed by growing a low-temperature buffer layer comprised of GaN to be 20 nm thick on the sapphire base 701.

Thereafter, the temperature is increased up to 1000° C., and TMG and $NH_3$ are fed, to deposit the GaN layer 702 on the sapphire base 701. Following this, $NH_3$, arsine, and TMG are fed to cause a substrate separating layer 703 comprised of GaN0.96As0.04 to be grown to be approximately 100 nm (FIG. 8A). At this time, its surface is a C surface. The substrate separating layer 703 is a nitride semiconductor layer which has a bandgap energy lower than that of the GaN based semiconductor layer formed later and tends to be phase-separated.

A material of the substrate separating layer 703 is GaN0.96As0.04 in this embodiment, but this is only illustrative, and semiconductor compound containing three or more elements belonging to III–V groups may be used. For example, the inside of the reactor may be set to approximately 800° C., and trimethyl indium (TMI) and TMG, and nitrogen as a carrier gas are fed, thereby growing the substrate separating layer 703 comprised of In0.2Ga0.8N to be approximately 100 nm. Further, $NH_3$, phosphine ($PH_3$), and TMG are fed, thereby growing the substrate separating layer 703 comprised of GaN0.96P0.04 to be approximately 100 nm.

Then, using the photolithography technique and the dry etching technique, the GaN layer 702 and the substrate separating layer 703 are formed to have recesses (concave portions), thereby forming periodic ridge stripes 702a. Then, using the technique for depositing the insulating film such as ECR sputtering, the $SiN_x$ layer 704 (10 nm thick) as the amorphous insulating film is deposited over the side surfaces of the ridge stripes 702a and the bottom surfaces of the recess portions 702b (FIG. 8B).

The ridge stripes 702a have a period F of 16 μm and a width T of 4 μm. Also, in this embodiment, the period F of the ridge stripes 702a is preferably approximately 5 μm to 100 μm, and more preferably, approximately 10 μm to 50 μm, as in the first embodiment. Also, the width T of the ridge stripes 702a is preferably approximately 1 μm to 10 μm, and more preferably 2 μm to 8 μm.

A direction of the stripes of the ridge stripes 702a is <1–100> direction of GaN. This is because, the longitudinal direction of a resonator preferably coincides with the direction of the stripes when the GaN based semiconductor substrate obtained as mentioned later is used as s semiconductor laser.

On the C surface of the substrate separating layer 703 exposed on top of the ridge stripe 702a (region indicated by reference numerals 703c in an enlarged portion in FIG. 8B), as the seed crystal, a GaN based semiconductor layer 706 (2 mm thick) is deposited by a pressure-reducing MOVPE process (FIG. 8C). As a result, between the $SiN_x$ layer 704 and the GaN based semiconductor layer 706, air gaps 705 are created. Thus, in this embodiment, crystal is grown only on the regions 703C and is not grown on the other region, for example, side surfaces of the ridge stripes 702a or bottom surfaces of the recess portions 702b. Parts of the GaN based semiconductor layer 706 are joined in the vicinity of the center of each of the air gaps 705 to form a joint portion 801.

Thereafter, the entire or part of the regions 703c in the substrate separating layer 703 corresponding to the seed crystal of the GaN based semiconductor layer 706 is irradiated with a ultraviolet laser beam 802 (Nd: a third harmonic of YAG laser (wavelength of 355 nm)) from the direction of a rear surface of the sapphire base 701. The substrate separating layer 703 is likely to be degraded due to thermal energy or photo energy. By irradiation of the laser beam 802, the regions 703c are photochemically degraded and removed. As a result, the GaN based semiconductor layer 706 grown on the sapphire base 701 is easily separated from the sapphire base 701.

Thus, the GaN based semiconductor layer 706 shown in FIG. 7A, i.e., the GaN based semiconductor substrate 706, is fabricated.

As a previous step of the step of separating the GaN based semiconductor layer 706 from the sapphire base 701 using the laser, thermal annealing is carried out using the method described in the first embodiment. This facilitates the separating step. Also as in the first embodiment, the method of moving the x-y stage is preferably used as the method of scanning the process laser beam.

When the GaN based semiconductor layer 706 is separated from the sapphire base 701, re-grown nitride based crystal hardly adheres to the substrate because of the presence of the air gaps surrounded by the side surfaces of the ridge stripes 702a, the bottom surfaces of the recess portions 702b, and the re-grown crystal. As a result, the GaN based semiconductor layer is separated more easily and quality of the separated GaN based semiconductor layer is higher than that in the prior art.

As described above, the fabrication method of this embodiment comprises a step of forming the substrate separating layer 703 as the semiconductor layer with the bandgap energy lower than that of the GaN based semiconductor layer 706, between the sapphire base 701 and the GaN based semiconductor layer 706. The substrate separating layer 703 with the bandgap smaller than that of the GaN based semiconductor layer 706 is comprised of semiconductor compound containing three or more elements belonging to III–V groups and tends to be phase-separated due to non-uniform composition because of its large lattice mismatching. Since the phase-separated substrate separating layer 703 has degraded crystallinity and has a number of defects and voids (holes), a stress applied on a surface thereof tends to be relieved. For this reason, the phase-separated substrate separating layer 703 is easily degraded by thermal energy or photo energy. So, thermal annealing and irradiation of the laser beam allow only the substrate separating layer 703 to be selectively removed. As a result, the GaN based semiconductor layer 706 is easily separated from the sapphire base 701.

However, if the substrate separating layer 703 is provided over the entire surface of the sapphire base 701, a joint area of the sapphire base 701 and the GaN based semiconductor layer 706 becomes large, and therefore, the GaN based semiconductor layer 706 is difficult to evenly separate. Accordingly, in this embodiment, the substrate separating layer 703 is formed in stripes for the purpose of reducing the joint area of the sapphire base 701 and the GaN based semiconductor layer 706. Thereby, by thermal annealing and laser beam irradiation of the stripe portions, the GaN based semiconductor layer 706 is separated from the sapphire base 701 more evenly without being degraded due to the laser beam.

Since compressive distortion applied on the GaN based semiconductor layer 706 on the sapphire base 701 is relieved by the phase-separated substrate separating layer 703, the GaN based semiconductor layer 706 separated from the sapphire base 701 has no cracks. As a result, a large-area GaN based semiconductor substrate is gained.

While the GaN layer 702 and the substrate separating layer 703 are provided with periodic ridge stripes 702a in this embodiment, the same effects are obtained by providing periodic lattice ridges instead.

As a matter of course, the invention is not intended to be limited to the above example, but various alternations may be made to the invention.

(Embodiment 4)

In a fourth embodiment of the present invention, a semiconductor laser capable of being easily separated from a substrate by providing a substrate separating layer and a fabrication method thereof, will be described.

FIG. 9A is a cross-sectional view showing a structure of a GaN Based semiconductor substrate fabricated by a fabrication method according to a fourth embodiment, and FIG. 9B is a cross-sectional view showing a structure of a substrate separated from the GaN based semiconductor substrate in a fabrication step thereof. FIG. 10A to FIG. 10E are cross-sectional views showing steps of the fabrication method according to this embodiment.

In FIG. 9A, reference numeral 506 denotes a GaN based semiconductor substrate. Over the GaN based semiconductor substrate 506, a n-Al0.1Ga0.9N/n-GaN super lattice contact layer 507, and a n-Al0.03Ga0.97N cladding layer 508 are deposited. The n-Al0.03Ga0.97N cladding layer 508 has periodic ridge stripes and recess portions. Over side surfaces of part of the ridge stripes and bottom surfaces of part of the recess portions, a $SiN_x$ layer 603, is provided. On the surfaces of the ridge stripes as seed crystal, a n-GaN light guiding layer 510, a multiple quantum well (MQW) active layer 511, a p-GaN light guiding layer 512, and a p-Al0.07Ga0.93N cladding layer 513 are grown and deposited.

On the p-Al0.07Ga0.93N cladding layer 513, ridge-shaped p-GaN layer 514 and p electrode 515 are provided. Over a region of the p-Al0.07Ga0.93N cladding layer 513 other than the ridge-shaped p-GaN layer 514 and the p electrode 515, an insulating film 516 is provided. On the p electrode 515 and the insulating film 516, a wiring electrode 518 is provided.

Over side surfaces of part of the ridge stripes and bottom surfaces of part of the recess portions provided in the n-Al0.03Ga0.97N cladding layer 508, an insulating film 516 is provided. On one of the ridge stripes, a n electrode 517 is provided and on the n electrode 517 and the insulating film 516, a wiring electrode 519 is provided.

In FIG. 9B, reference numeral 501 denotes a sapphire base. On the sapphire base 501, a GaN layer 502 is provided. The GaN layer 502 is processed to have a plurality of ridge stripes 502a and recess portions 502b. Over side surfaces of the ridge stripes 502a and bottom surfaces of the recess portions 502b, a $SiN_x$ layer 504 comprised of an amorphous insulating film, is provided.

As mentioned later, a semiconductor laser shown in FIG. 9A is fabricated by separating the same from the sapphire base 501 or the like shown in FIG. 9B.

Next, a detail of the fabrication method according to this embodiment will be described.

In the same manner described in the first embodiment, the surface of the sapphire base 501 is thermally cleaned, and then, inside the reactor of the MOVPE unit, the temperature is reduced to approximately 500° C., followed by growing a low-temperature buffer layer comprised of GaN to be 20 nm thick on the sapphire base 501.

Thereafter, the temperature is increased up to 1000° C., and TMG and $NH_3$ are fed, to deposit the GaN layer 502 on the sapphire base 501. Following this, $NH_3$, arsine, and TMG are fed to cause a substrate separating layer 503 comprised of GaN0.96As0.04 to be grown to be approximately 100 nm (FIG. 10A). At this time, its surface is a C surface. The substrate separating layer 503 is a nitride semiconductor layer which has a bandgap energy lower than that of the GaN based semiconductor layer formed later and tends to be phase-separated, as in the substrate separating layer of the third embodiment.

A material of the substrate separating layer 503 is GaN0.96As0.04 in this embodiment, but this is only illustrative, and semiconductor compound containing three or more elements belonging to III–V groups may be used, as in the third embodiment.

Then, using the photolithography technique and the dry etching technique, the GaN layer 502 and the substrate separating layer 503 are formed to have recesses (concave portions), thereby forming periodic ridge stripes 502a. Then, using a technique for depositing an insulating film such as ECR sputtering, the $SiN_x$ layer 504 (10 nm thick) as the amorphous insulating film is deposited over the side surfaces of the ridge stripes 502a and the bottom surfaces of the recess portions 502b (FIG. 10B).

The ridge stripes 502a have a period F of 16 $\mu$m and a width T of 4 $\mu$m. The period F of the ridge stripe 502a is preferably in a range of approximately 5 $\mu$m to 100 $\mu$m, and more preferably in a range of approximately 10 $\mu$m to 50 $\mu$m. The width T of the ridge stripes 502a is preferably in a range of approximately 1 $\mu$m to 10 $\mu$m and more preferably in a range of approximately 2 $\mu$m to 8 $\mu$m.

A direction of the stripes of the ridge stripes 502a is <1–100> direction of GaN. This is because, the longitudinal direction of a resonator preferably coincides with the direction of the stripes.

On the C surface of the substrate separating layer 503 exposed on top of the ridge stripes 502a (region represented by 503c in an enlarged portion in FIG. 10B), as the seed crystal, the n-Al0.03Ga0.9N layer 506 (2 $\mu$m thick), the n-Al0.1Ga0.9N/n-GaN super lattice contact layer 507 (2 $\mu$m thick), and the n-Al0.03Ga0.97N cladding layer 508 (0.5 $\mu$m thick) are sequentially deposited, by the pressure-reducing MOVPE process (FIG. 10C). As a result, between the $SiN_x$ layer 504 and the n-Al0.03Ga0.97N layer 506, air gaps 505 are created. Thus, in this embodiment, crystal is grown only on the regions 502C and is not grown on the other regions, for example, side surfaces of the ridge stripes 502a or bottom surfaces of the recess portions 502b. Parts of the n-Al0.03Ga0.97N layer 506 are joined in the vicinity of the center of each of the air gaps 505 to form a joint portion 601.

Then, the n-AlGaN cladding layer 508 is formed to have recesses (concave portions), thereby forming periodic ridge stripes. At this time, the n-AlGaN cladding layer 508 may be etched to the n-Al0.1Ga0.9N/n-GaN super lattice contact layer 507. Over the side surfaces of the ridge stripes and the bottom surfaces of the recess portions, the SiN$_x$ layer 603 (10 nm thick) is deposited (FIG. 10D). The period of the ridge stripes is 16 μm and the width thereof is approximately 3 μm. The ridge stripes having the width of approximately 3 μm are formed in regions with fewer through dislocations which are located above the air gaps 505.

On the C surface of the n-Al0.07Ga0.93N cladding layer 507 exposed on top of the ridge, as seed crystal, the n-GaN light guiding layer 510 (0.2 μm thick), the multiple quantum well (MQW) active layer 511, the p-GaN light guiding layer 512 (0.1 μm thick), and the p-Al0.07Ga0.93N cladding layer 513 (2 μm thick) are sequentially deposited by a pressure-reducing MOVPE process (FIG. 1E). As a result, between the SiN$_x$ layer 603 and the p-GaN light guiding layer 512 and the p-Al0.07Ga0.93N cladding layer 513, air gaps 509 are created. Parts of the p-Al0.07Ga0.93N cladding layer 513 are joined in the vicinity of the center of each of the air gaps 509.

Although not shown in FIG. 10E, as shown in FIG. 9A, the p electrode 515 is deposited on the p-GaN layer 514, and the p electrode 515, the p-GaN layer 514, and the p-AlGaN cladding layer 513 are formed to have ridges with a width of approximately 5 μm. Over the exposed p-Al0.07Ga0.93N cladding layer 513, an insulating film 516 comprised of SiO$_2$ or the like is applied, thereby forming a current narrowing structure. The insulating film 516 is formed by the ECR sputtering. On the p electrode 515 and the insulating film 516, the wiring electrode 518 comprised of Au is formed to be 5 μm thick. Likewise, as shown in FIG. 9A, side surfaces of part of the ridge stripes and bottom surfaces of part of the recess portions in the n-Al0.03Ga0.97N cladding layer 508 are coated with the insulating film 516. On one of the ridge stripes, the n electrode 517 is formed and on the n electrode 517 and the insulating film 516, the wiring electrode 519 is formed.

Thereafter, as shown in FIG. 10E, the entire or part of the regions 503C of the substrate separating layer 503 as seed crystal of n-Al0.03Ga0.97N 506 is irradiated with a ultraviolet laser beam 602 (Nd: a third harmonic of YAG laser (wavelength of 355 nm)), from the direction of a rear surface of the sapphire base 501. The substrate separating layer 503 tends to be degraded by thermal energy or photo energy. For this reason, the irradiation of the laser beam 602 causes the regions 503c to be photochemically degraded and removed. As a result, the GaN based semiconductor layer 506 grown on the sapphire base 501 is easily separated from the sapphire base 501.

Thus, the semiconductor laser shown in FIG. 10A is fabricated.

As a previous step of the step of separating the GaN based semiconductor layer 506 from the sapphire base 501 using the laser, thermal annealing is carried out using the method described in the first embodiment. This facilitates the separating step. Also as in the first embodiment, the method of moving the x-y stage is preferably used as the method of scanning the process laser beam.

When the GaN based semiconductor layer 506 is separated from the sapphire base 501, re-grown nitride based crystal hardly adheres to the substrate because of the presence of the air gaps surrounded by the side surfaces of the ridge stripes, the bottom surfaces of the recess portions, and the re-grown crystal. As a result, the GaN based semiconductor layer is separated more easily and quality of the separated GaN based semiconductor layer is higher than that in the prior art.

As in the third embodiment, by providing the substrate separating layer 503, the GaN based semiconductor layer 506 is easily separated from the sapphire base 501, and the GaN based semiconductor substrate having a larger area is obtained.

While the GaN layer 502 and the substrate separating layer 503 are provided with periodic ridge stripes in this embodiment, the same effects are obtained by providing periodic lattice ridges instead.

As a matter of course, the invention is not intended to be limited to the above example, but various alternations may be made to the invention.

In the third and fourth embodiment, various possible examples of semiconductor compound for use as the substrate separating layer, include GaNAs, GaInN, AlGaN, GaNP, etc. It is advantageous that the wavelength of the laser beam for separating the GaN based semiconductor layer from the sapphire base varies depending on a composition of such compound.

Hereinbelow, the relationship between the wavelength of the laser beam and the composition of the substrate will be described.

Figure 11:
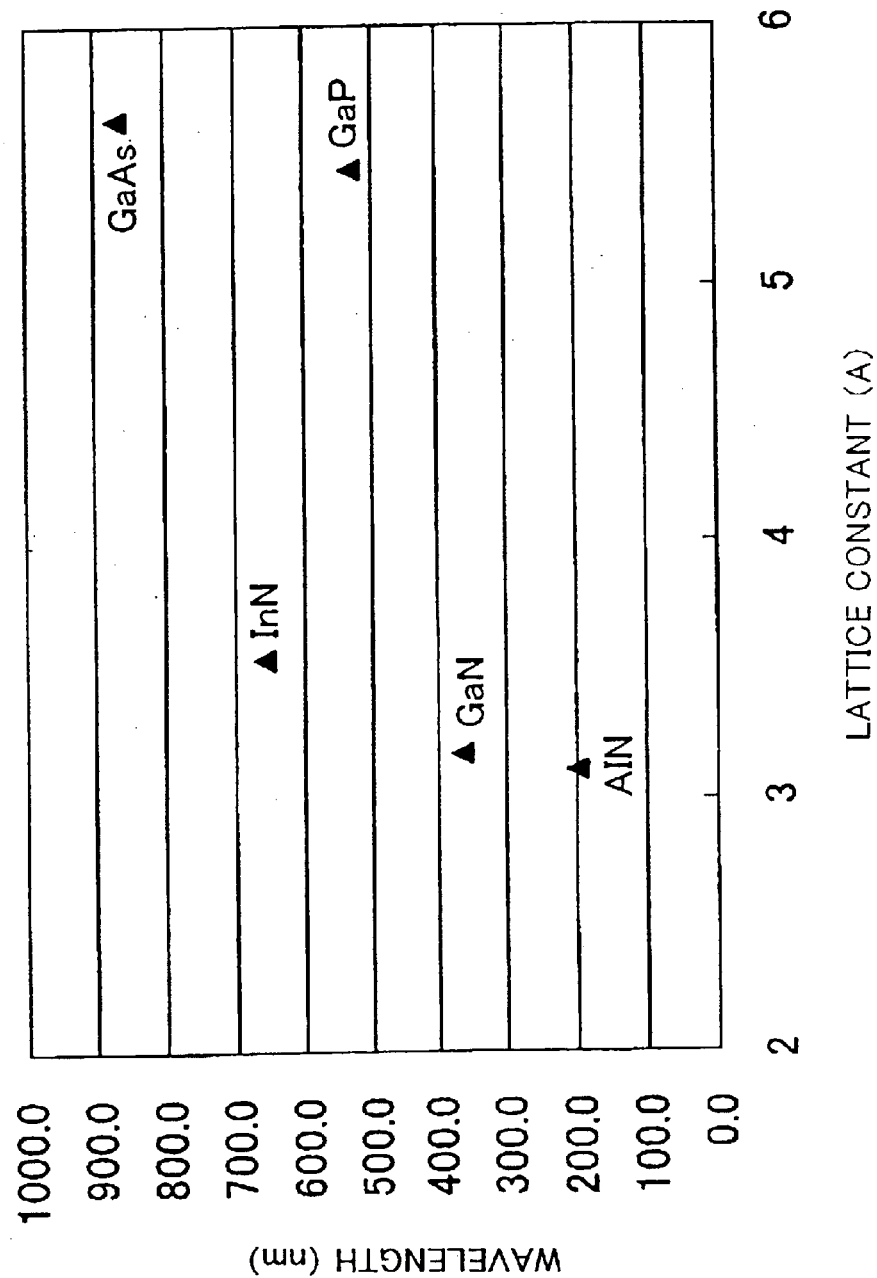
FIG. 11 is a graph showing a relationship between an absorption end wavelength and a lattice constant in nitride crystal.

FIG. 11 is a graph showing a relationship between an absorption end wavelength and a lattice constant in nitride crystal. In the case of using InGaN as the substrate separating layer, if the ratio of In:Ga is changed from 4:6 to 6:4, the laser beam has a wavelength of approximately 530 nm and therefore, Nd: a second harmonic of YAG laser can be used. On the other hand, crystallinity decreases with an increase in the percentage of In, which adversely affects quality of nitride crystal to be re-grown. It is therefore desirable to set In composition to not higher than 5 in In:Ga ratio of 5:5. In the case where GaNAs or GaNP is used for the substrate separating layer, crystallinity decreases due to difference in crystal structure between GaN and GaAs, and GaP, which adversely affects quality of the nitride crystal to be re-grown. It is therefore to set As or P composition to 5% or less. In this case, optimum wavelength of the laser beam is about 400 nm, but Nd:YAG and YLF lasers or XeF excimer laser, which has a wavelength of about 350 nm, is preferably used, because they have exhibited performance as process lasers. When AlGaN is used for the substrate separating layer, the laser beam having a wavelength ranging from 190 nm to 360 nm is advantageously used, but damages an active layer of the laser. Therefore, favorably, a laser beam having a wavelength of about 350 nm is used. In view of the above, it is desired that the wavelength of the laser beam used in the present invention be in a range of approximately 190 nm to 550 nm.

Numerous modifications and alternative embodiments of the invention will be apparent to those skilled in the art in the light of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

What is claimed is:

1. A method of fabricating a nitride based semiconductor substrate, comprising the steps of:

depositing a first nitride based semiconductor layer on a base;

processing the first nitride based semiconductor layer to have ridge portions and recess portions;

coating side surfaces of the ridge portions and bottom surfaces of the recess portions with an amorphous insulating film;

growing a second nitride based semiconductor layer on a region of the first nitride based semiconductor layer other than a region thereof coated with the amorphous insulating film, the region of the first nitride based semiconductor layer serving as seed crystal; and separating the second nitride based semiconductor layer from the ridge portions by irradiating the region corresponding to the seed crystal with a laser beam.

2. The method of fabricating a nitride based semiconductor substrate according to claim 1, further comprising the step of thermally annealing the base with the first and second nitride based semiconductor layers deposited thereon, before the separating step.

3. The method of fabricating a nitride based semiconductor substrata according to claim 1, wherein the laser beam has a wavelength of 190 nm to 550 nm.

4. The method of fabricating a nitride based semiconductor substrate according to claim 1, wherein the ridge portions are ridge stripes and a direction of the stripes is a <1–100> direction of nitride.

5. A method of fabricating a nitride based semiconductor device, comprising the steps of:
depositing a first nitride based semiconductor layer on a base;
processing the first nitride based semiconductor layer to have ridge portions and recess portions;
coating side surfaces of the ridge portions and bottom surfaces of the recess portions with an amorphous insulating film;
growing a second nitride based semiconductor layer on a region of the first nitride based semiconductor layer other than a region thereof coated with the amorphous insulating film, the region of the first nitride based semiconductor layer serving as seed crystal;
depositing a layer having an active layer structure with an active layer interposed between semiconductor layers of different conductivity types, on the second nitride based semiconductor layer; and
separating the second nitride based semiconductor layer from the ridge portions by irradiating the region corresponding to the seed crystal with a laser beam.

6. A method of fabricating a nitride based semiconductor substrate, comprising the steps of:
depositing a first nitride based semiconductor layer on a base;
depositing a second nitride based semiconductor layer on the first nitride based semiconductor layer;
processing the first and second nitride based semiconductor layers to have ridge portions and recess portions;
coating side surfaces of the ridge portions and bottom surfaces of the recess portions with an amorphous insulating film;
growing a third nitride based semiconductor layer on a region of the second nitride based semiconductor layer other than a region thereof coated with the amorphous insulating film, the region of the second nitride based semiconductor layer serving as seed crystal; and
separating the third nitride based semiconductor layer from the ridge portions by irradiating the region corresponding to the seed crystal with a laser beam, wherein
the second nitride based semiconductor layer has a bandgap smaller than a bandgap of the third nitride based semiconductor layer.

7. The method of fabricating a nitride based semiconductor substrate according to claim 6, further comprising thermally annealing the base with the first, second, and third nitride based semiconductor layers deposited thereon, before the separating step.

8. The method of fabricating a nitride based semiconductor substrate according to claim 6, wherein the ridge portions are ridge stripes and a direction of the stripes is a <1–100> direction of nitride.

9. The method of fabricating a nitride based semiconductor substrate according to claim 6, wherein the laser beam has a wavelength of 190 nm to 550 nm.

10. The method of fabricating a nitride based semiconductor substrate according to claim 6, wherein the second nitride based semiconductor layer is comprised of semiconductor compound containing three or more elements belonging to III–V groups.

11. The method of fabricating a nitride based semiconductor substrate according to claim 10, wherein the second nitride based semiconductor layer contains at least As.

12. The method of fabricating a nitride based semiconductor substrate according to claim 10, wherein the second nitride based semiconductor layer contains at least In.

13. The method of fabricating a nitride based semiconductor substrate according to claim 10, wherein the second nitride based semiconductor layer contains at least P.

14. A method of fabricating a nitride based semiconductor device, comprising the steps of:
depositing a first nitride based semiconductor layer on a base;
processing the first nitride based semiconductor layer to have first ridge portions and first recess portions;
coating side surfaces of the first ridge portions and bottom surfaces of the first recess portions with an amorphous insulating film;
growing a second nitride based semiconductor layer on a region of the first nitride based semiconductor layer other than a region thereof coated with the amorphous insulating film, the region of the first nitride based semiconductor layer serving as first seed crystal;
processing the second nitride based semiconductor layer to have second ridge portions and second recess portions;
coating side surfaces of the second ridge portions and bottom surfaces of the second recess portions with an amorphous insulating film;
growing a third nitride based semiconductor layer on a region of the second nitride based semiconductor layer other than a region thereof coated with the amorphous insulating film, the region of the second nitride based semiconductor layer serving as second seed crystal;
depositing a layer having an active layer structure with an active layer interposed between semiconductor layers of different conductivity types, on the third nitride based semiconductor layer; and
separating the second nitride based semiconductor layer from the first ridge portions by irradiating the region corresponding to the first seed crystal with a laser beam.

15. A method of fabricating a nitride based semiconductor device, comprising the steps of:
depositing a first nitride based semiconductor layer on a base;
depositing a second nitride based semiconductor layer on the first nitride based semiconductor layer;
processing the first and second nitride based semiconductor layers to have ridge portions and recess portions;

coating side surfaces of the ridge portions and bottom surfaces of the recess portions with an amorphous insulating film;

growing a third nitride based semiconductor layer on a region of the second nitride based semiconductor layer other than a region thereof coated with the amorphous insulating film, the region of the second nitride based semiconductor layer serving as seed crystal;

depositing a layer having an active layer structure with an active layer interposed between semiconductor layers of different conductivity types, on the third nitride based semiconductor layer; and separating the third nitride based semiconductor layer from the ridge portions by irradiating the region corresponding to the seed crystal with a laser beam, wherein the second nitride based semiconductor layer has a bandgap smaller than a bandgap of the third nitride based semiconductor layer.

16. The method of fabricating a nitride based semiconductor device according to claim 15, further comprising the steps of:

between the step of depositing a layer having an active layer structure and the step of separating the third nitride based semiconductor layer from the ridge portions, processing the third nitride based semiconductor layer to have second ridge portions and second recess portions;

coating side surfaces of the second ridge portions and bottom surfaces of the second recess portions; and growing a fourth nitride based semiconductor layer on a region of the third nitride based semiconductor layer other than a region thereof coated with the amorphous insulating film, the region of the third nitride based semiconductor layer serving as second seed crystal.

17. A method of fabricating a nitride based semiconductor device, comprising the steps of:

depositing a first nitride based semiconductor layer on a base;

processing the first nitride based semiconductor layer to have ridge portions and recess portions;

coating side surfaces of the ridge portions and bottom surfaces of the recess portions with an amorphous insulating film;

growing a second nitride based semiconductor layer on a region of the first nitride based semiconductor layer other than a region thereof coated with the amorphous insulating film, the region of the first nitride based semiconductor layer serving as seed crystal;

depositing a layer having an active layer structure with an active layer interposed between semiconductor layers of different conductivity types, on the second nitride based semiconductor layer; and separating the second nitride based semiconductor layer from the ridge portions by irradiating the region corresponding to the seed crystal with a laser beam.

18. The method of fabricating a nitride based semiconductor device according to claim 15, wherein the second nitride based semiconductor layer is comprised of semiconductor compound containing three or more elements belonging to III–V groups.

19. The method of fabricating a nitride based semiconductor device according to claim 15, wherein the second nitride based semiconductor layer contains at least As.

20. The method of fabricating a nitride based semiconductor device according to claim 15, wherein the second nitride based semiconductor layer contains at least In.

21. The method of fabricating a nitride based semiconductor device according to claim 15, wherein the second nitride based semiconductor layer contains at least P.

22. The method of fabricating a nitride based semiconductor device according to claim 14, wherein the active layer is formed so as to overlap with the second recess portions as seen in a cross-sectional view.

* * * * *

UNITED STATES PATENT AND TRADEMARK OFFICE
CERTIFICATE OF CORRECTION

PATENT NO.     : 6,806,109 B2
DATED          : October 19, 2004
INVENTOR(S)    : Hiroyuki Furuya et al.

It is certified that error appears in the above-identified patent and that said Letters Patent is hereby corrected as shown below:

<u>Title page,</u>
Item [56], References Cited, U.S. PATENT DOCUMENTS, insert
-- 2003/0203629  10/2005  Ishibashi et al ………..438/689 --.

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,806,109 B2 | Page 1 of 1 |
| APPLICATION NO. | : 10/620432 | |
| DATED | : October 19, 2004 | |
| INVENTOR(S) | : Hiroyuki Furuya et al. | |

It is certified that error appears in the above-identified patent and that said Letters Patent is hereby corrected as shown below:

<u>Title page,</u>
Item [56], References Cited, U.S. PATENT DOCUMENTS, insert
-- 2003/0203629  10/2003  Ishibashi et al ...........438/689 --.

This certificate supersedes Certificate of Correction issued July 12, 2005.

Signed and Sealed this

Twenty-first Day of August, 2007

JON W. DUDAS
*Director of the United States Patent and Trademark Office*